United States Patent [19]

Oswald

[11] 4,303,808
[45] Dec. 1, 1981

Best Available Copy

[54] LOCATING NOISE IN COMMUNICATIONS SYSTEMS

[75] Inventor: Thomas Oswald, Dartford, England

[73] Assignee: International Standard Electric Corporation, New York, N.Y.

[21] Appl. No.: 83,492

[22] Filed: Oct. 10, 1979

[30] Foreign Application Priority Data

Oct. 26, 1978 [GB] United Kingdom ............... 41984/78

[51] Int. Cl.³ .............................................. H04B 3/46
[52] U.S. Cl. .............................................. 179/175.3 F
[58] Field of Search ........................... 343/112 D, 103; 179/175.3 F

[56] References Cited

U.S. PATENT DOCUMENTS 3,710,239 1/1973 Nakamura ..................... 179/175.3 F Primary Examiner—Theodore M. Blum
Attorney, Agent, or Firm—John T. O'Halloran; Alfred C. Hill

[57] ABSTRACT

An impulse noise source in a bidirectional submerged communications system is positionally located by detection apparatus at one end of the system which measures the time interval between the same impulse arriving twice at the one end of the system, firstly, via a shorter or faster path in the system (either the incoming path to the one end, or a reference frequency band in the incoming path) and, secondly, via a longer or slower path in the system (either the go path from the noise source, a go/return distant loop and the incoming path, or another frequency band in the incoming path). Group delay distortion of the system affects the location accuracy and is equalized by networks in the detection apparatus.

19 Claims, 9 Drawing Figures

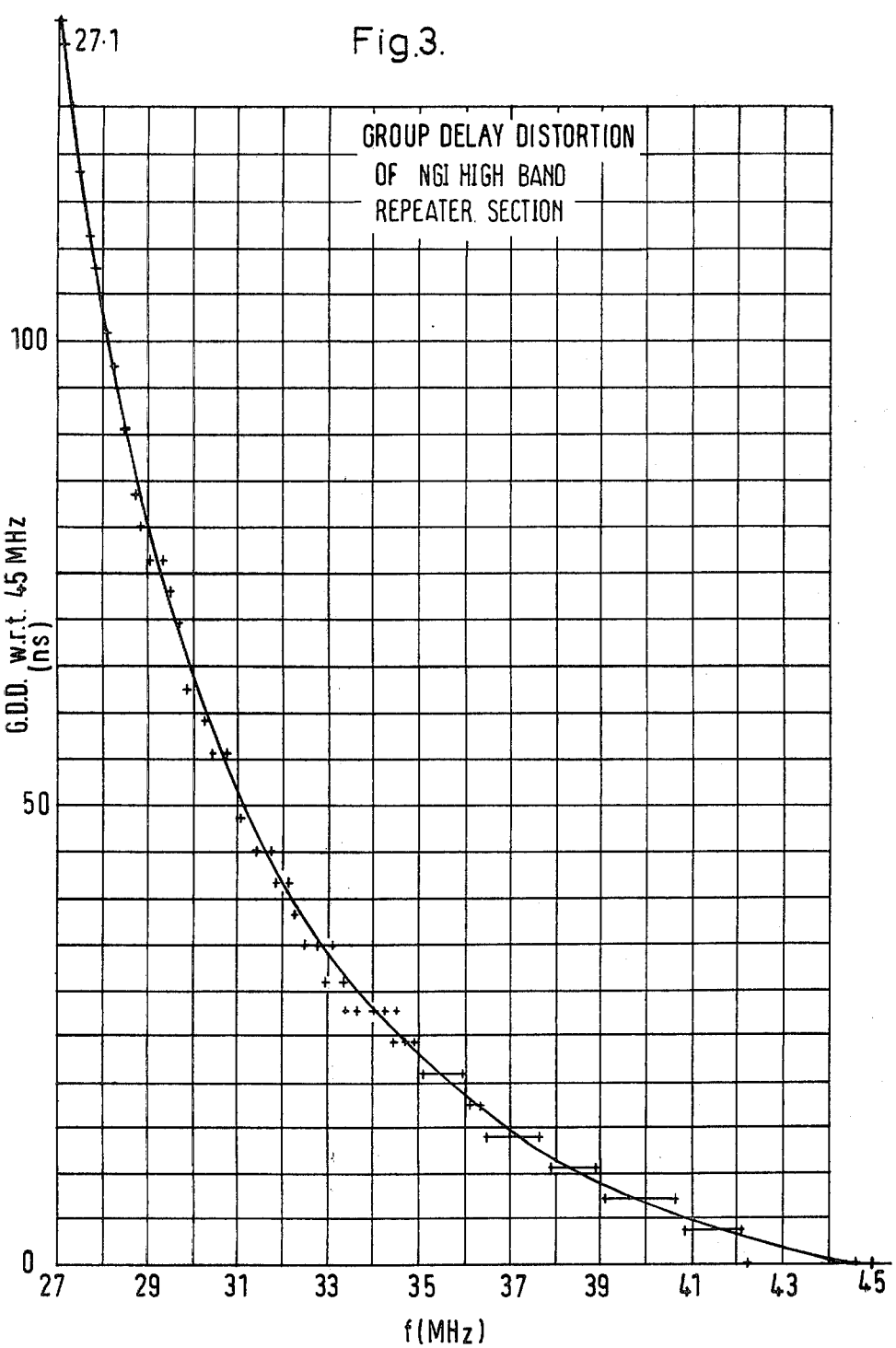

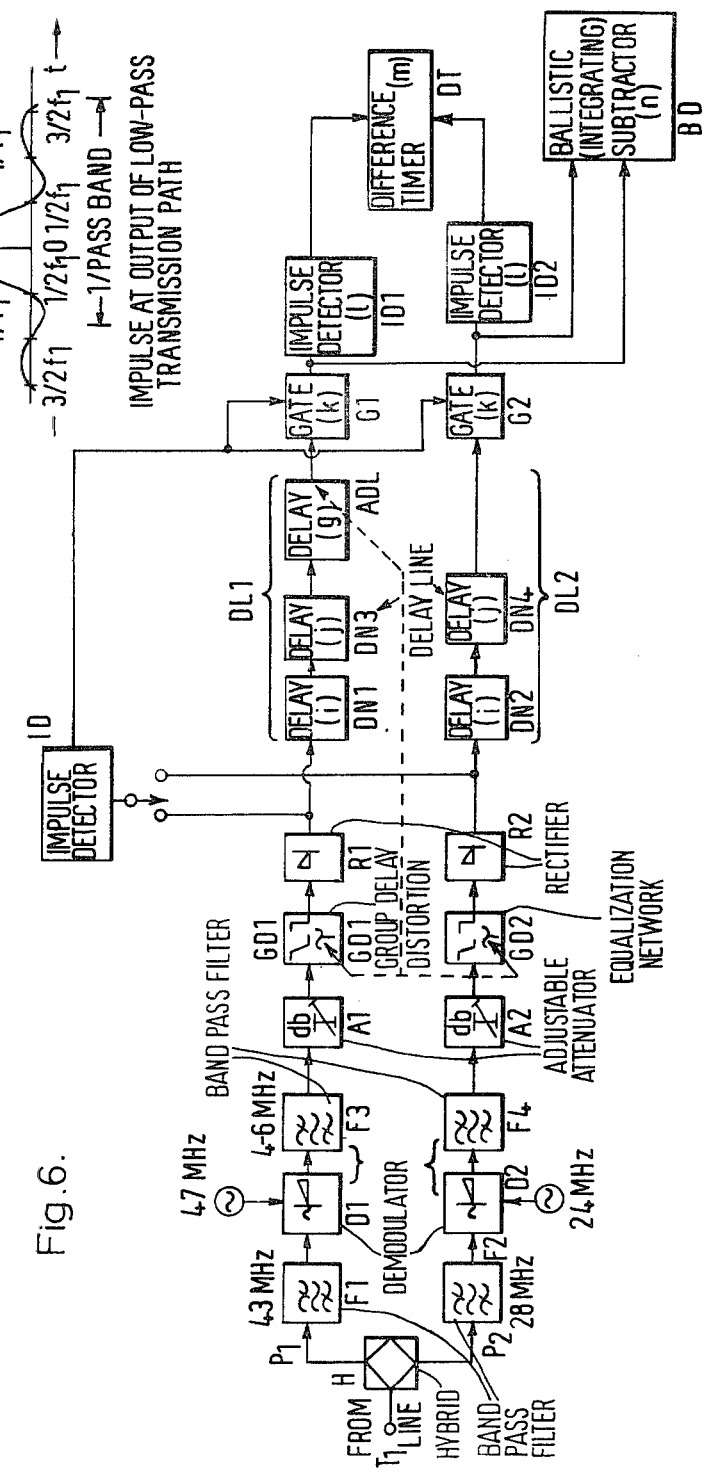

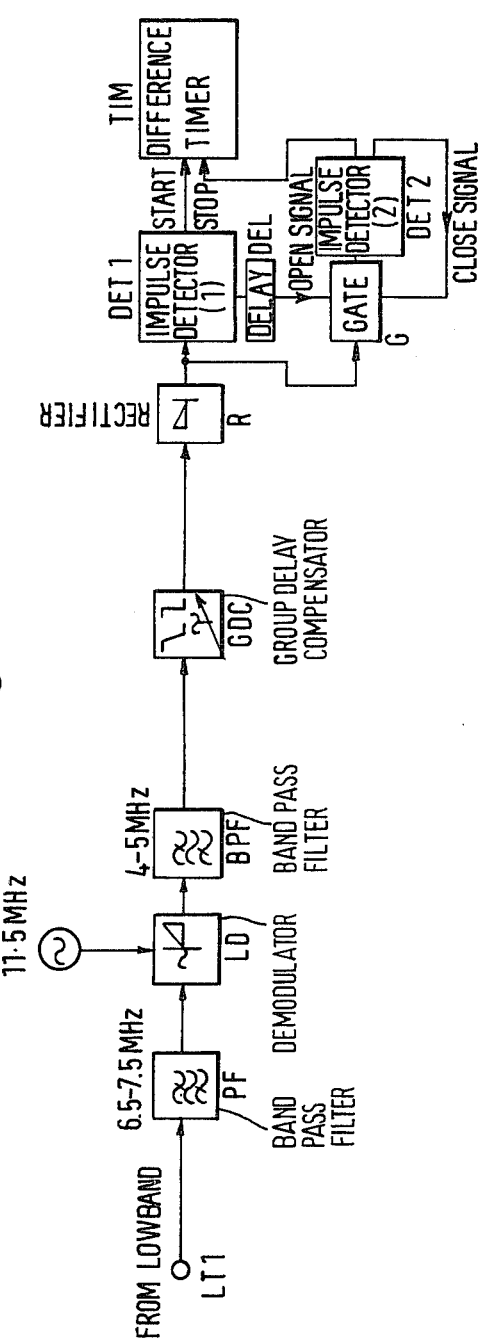

LOCATING NOISE IN COMMUNICATIONS SYSTEMS

BACKGROUND OF THE INVENTION

This invention relates to locating impulse noise in a communications system, particularly but not exclusively a submerged telecommunications system.

With the now widespread use of data circuits on submerged telecommunications systems, telephone administrations are specifying minimum performances for impulse noise generation. The simplified supervisory circuits of modern system repeaters have no facilities to detect noise uncorrelated with the signal and it is not desirable to increase their complexity and cost to enable them to do so. This means that, if an installed system is giving unsatisfactory service on this account, it could be an onerous and very expensive procedure to make many cuts into the system to find the faulty part. With this in mind, expensive testing procedures, during the production of a system, are required. These test the repeater apparatus at the time of manufacture but subsequent additions, such as cable and joints, cannot be tested in the factory and the effects of any subsequent degradation cannot be taken into account.

Sources of impulse noise. There are three main sources of impulse noise in a repeatered submarine telecommunication system:

(a) The high voltage cable and joints and, more importantly, at the repeater, the entry joints, glands and small-diameter entry cable. It can be shown that the spectral density of this type of noise is independant of frequency, for a given charge transferred at the impulse, and, since it occurs more importantly at a repeater input, it bears a constant ratio to thermal noise.

(b) The high voltage blocking capacitor at the repeater input which forms part of the power separation filter of the repeater, including its seal and any other insulation directly in parallel with it. For a given charge transferred, this is a less important contributor than (a) since the capacitor itself largely decouples the repeater signal circuits from the impulse. The spectral density of the noise is greatest at the bottom end of the traffic band and falls off rapidly with frequency, for example, at 12 db per octave. Thus, it is unlikely to make most of the traffic band unserviceable—both because of its limited spectrum and because the signal relative level is high.

(c) The capacitance to sea of the body of the repeater, including any high voltage capacitor used to augment it. In principle, this is a much more prolific source of noise, being subject to scattered insulation paths with large exposed surfaces—such as perspex bars and a polythene shell. But the noise is well decoupled by the components necessary to provide a high singing-loop loss across the repeater—especially if a capacitor is fitted. This noise is not amenable to calculation (although a repeater prototype could be calibrated by a standard discharge) since the loop loss is set by ill defined parasitic components, but it should not be a problem in a well designed repeater. This noise is likely to be greatest at the extreme ends of the spectrum, i.e., where the loss from the center capacitance to the signal path is least.

SUMMARY OF THE INVENTION

It is an object of the present invention to locate impulse noise in a transmission system. A feature of the present invention is the provision of a method of locating impulse noise in a transmission system comprising the steps of measuring the time interval between the same noise impulse arriving at one terminal of the system via two paths of the system having different delays; and indicating the time interval in a manner representing the distance of the source of the impulse from the one terminal to locate the position of the source of the impulse in the system.

There are two preferred embodiments. In the first the two paths are in opposite directions of transmission and looped at a remote end of the system and observed and detected at the other end. In the second embodiment the two paths are in the same direction of transmission, but in different parts of the frequency spectrum for that transmission direction.

BRIEF DESCRIPTION OF THE DRAWING

Above-mentioned and other features and objects of this invention will become more apparent by reference to the following description taken in conjunction with the accompanying drawing, in which:

FIG. 3 is a graph showing variation of group delay distortion of a typical submersible repeater with frequency in the high transmission band;

FIG. 6 is a block circuit diagram of apparatus for locating impulse noise within one band in a submersible transmission system according to the principle of one embodiment of the present invention;

FIG. 6A is a graph illustrating the wave shape of a typical noise impulse; and

FIG. 7 is a block circuit diagram of apparatus for locating impulse noise bi-directional transmission according to the principles of another embodiment of the present invention.

DESCRIPTION OF THE PREFERRED EMBODIMENT

Figure 1:
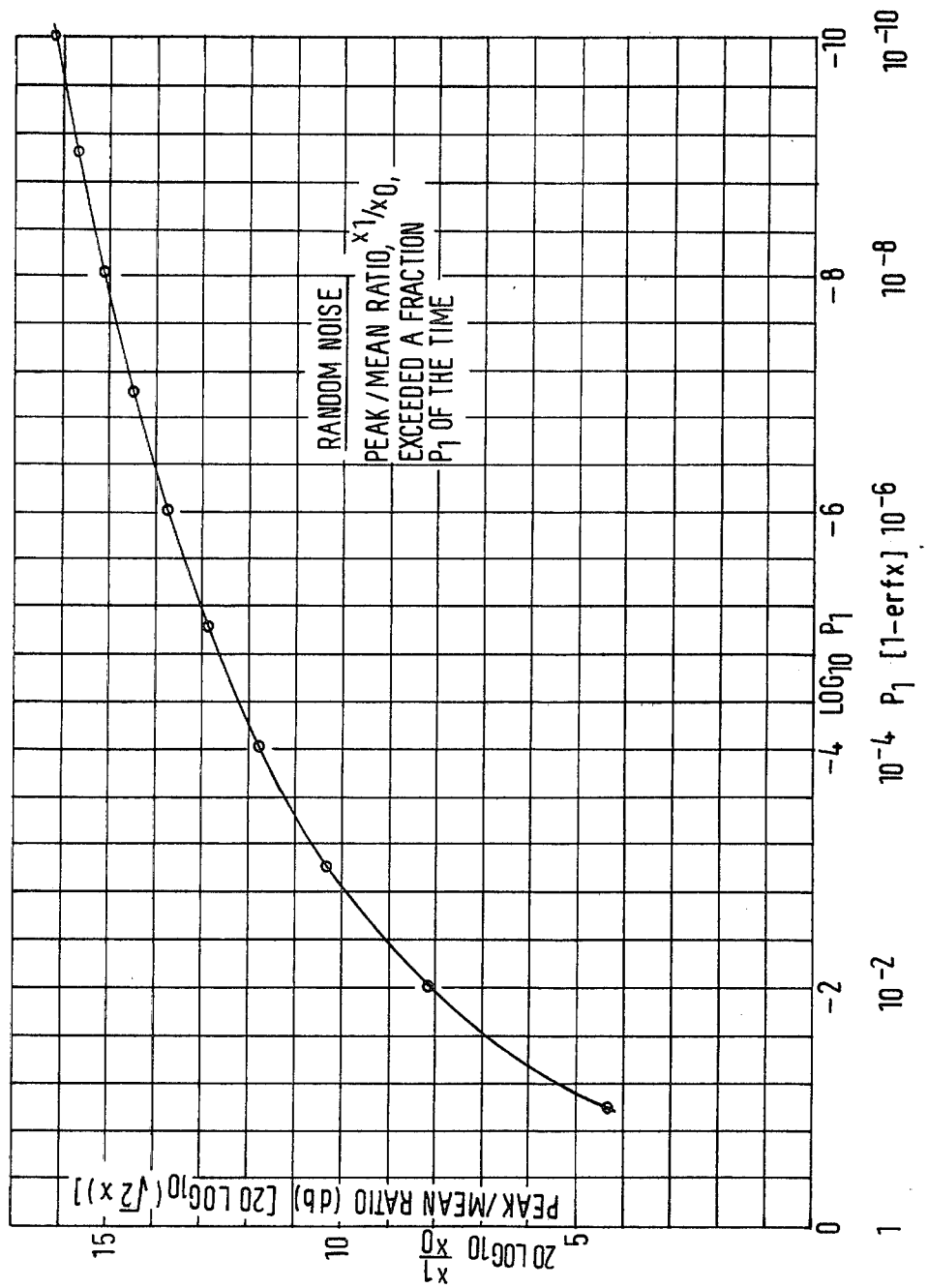
FIG. 1 is a graph showing the variation of peak/mean ratio of random noise with time.

Nature of impulse noise. In tests on apparatus, two types are commonly observed. The first is a sporadic type of noise characterized by impulses of short duration, widely scattered in both amplitude and time. For instance, the specification for a typical long system is that there should be no more than 6 impulses in any 15 minute period which exceed −25 dbmO (decibels referred to one milliwatt) in a voice channel. If the performance were say three times as bad as this, there would still be an occurrence of no more than one in a minute. The amplitude of the disturbance is large: even on a route as long as 3400 n.m. (nautical miles) operated at a (thermal) noise level of 2 pw/km (picowatt per kilometer) (−47 dbmO, unweighted) the peak of the smallest specified impulse is some 22 db (decibels) above the (long term) RMS (root mean square) level of background noise. A threshold set to detect this level will then be practically unaffected by thermal noise (see FIG. 1). Moreover, this sensitivity to thermal noise can be increased by an increase of the test bandwidth. The peak amplitude of the impulse is proportional to observed bandwidth, whereas, since the peak to mean ratio of random noise is independant of bandwidth, the peak amplitude of thermal noise is proportional to the square root of the bandwidth: e.g. for an observed band of 1 MHz (megahertz), the effect of thermal noise is reduced by some 25 db with respect to a measurement in a voice band.

The second type is a more or less continuous noise which is, converted to audio frequencies, manifest as a continuous crackle or rushing noise. This type may be of less importance both because, if it becomes evident, the system is already likely to have had its performance impaired by more sporadic manifestations of noise, and because it is likely to be the degradation or terminal stage of the first type—so that the system could rapidly become worse, fail by voltage breakdown and bring the main fault location methods into play.

Referring to the first embodiment of the invention an impulse generated by the cable or adjacent apparatus will be propagated in both directions at once, in the high and low frequency bands. If the bands are looped together at one end and observed at the other, the ratio of the propagation times for the same impulse received via the two paths is equal to that of the distances travelled—i.e. the location of the fault, as a fraction of the route length is equal to $1-T/T_o$, where T is the time difference between impulses and $T_o$ is the overall propagation time over the complete loop (neglecting the application of corrections). Calibrations are possible at $T=O$ and $T=T_o$. A simple timer, such as is commercially available, with suitable triggers—set by the first received impulse and stopped by the other—would suffice.

A refinement would be to allow for the delay at the loop and the pick-off filters and for the slightly different net propagation velocities in the two paths.

This method is not useful to locate those types of sporadic noise sources which could produce very little energy in one band. It can also be objected to on the basis of the differences in relative noise level at the impulse injection point in the two bands. This difference in level, with respect to thermal noise, of the impulses from one source at a repeater/cable interface in the two bands is equal to the repeater section loss minus the difference in noise factors of the two bands of the repeater for noise sources having a uniform frequency spectrum.

Figure 4:
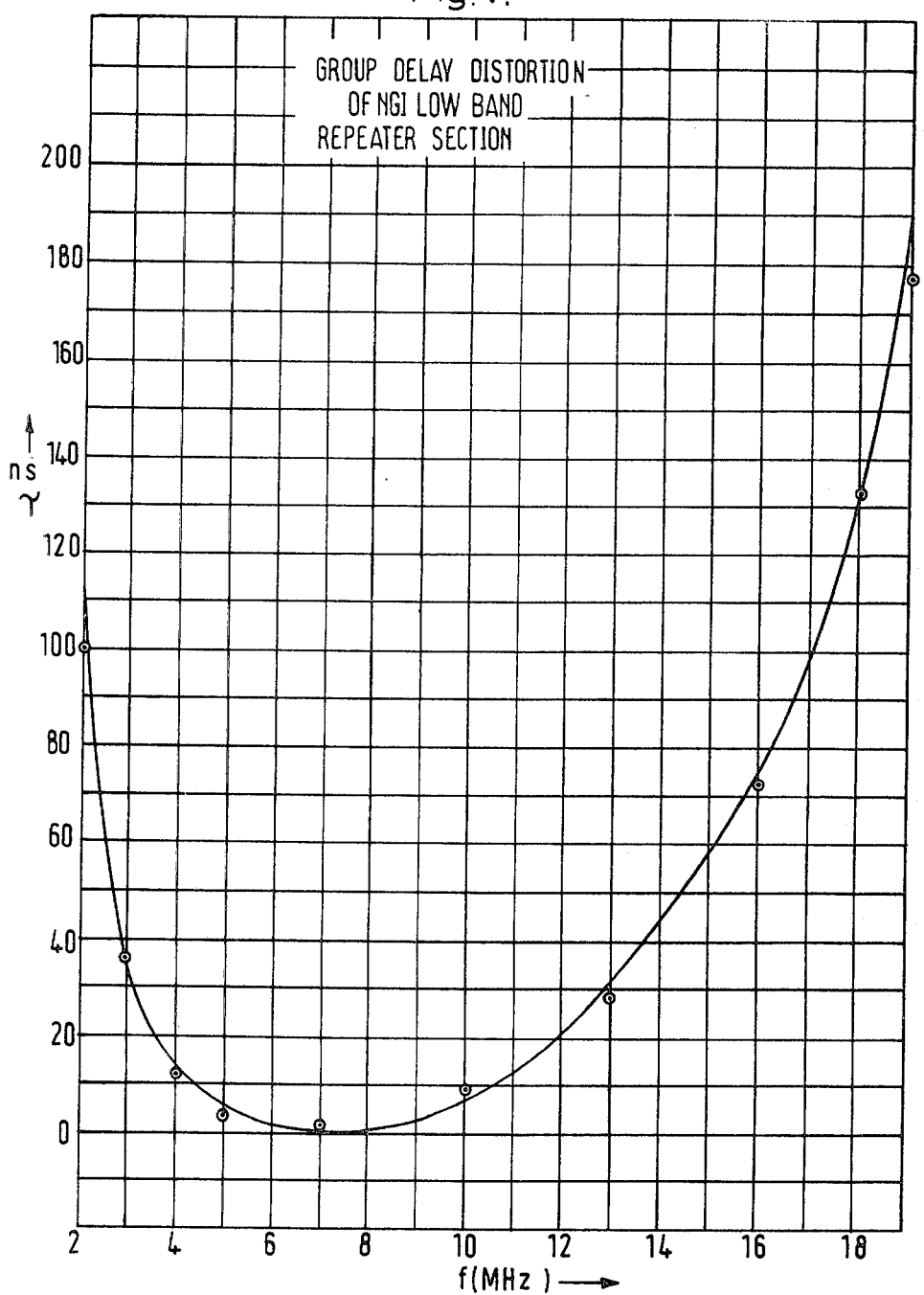
FIG. 4 is a graph showing variation of group delay distortion of a typical repeater with frequency in the low transmission band.

The worst case occurs when the noise source is at the high band output/low band input end of a repeater where the difference could be 30 db for the repeater of FIGS. 3 and 4. For lower frequency, high gain repeaters, the difference could be up to 50 db. In our current (NG1-45 MHz) system having an impulse noise source at, say, a cable joint, repeater entry joint or gland, etcetera, the sensitivity to thermal noise should be low enough for the above method to be feasible. Low group delay distortion in the return, incoming and outgoing bands is necessary, since spreading the pulse in time must be avoided otherwise its peak amplitude will be reduced. The most suitable bands are centered at about 43 MHz in the high band and at about 7 MHz in the low band and translation between these bands is required at the remote loop.

The return band is group delay equalized for the length of the route, but the equalization for the other paths depends on the distance to the fault. About half of the route requirement in each impulse path is the average amount required. The relative amounts could be adjusted when an approximate location is obtained. Another refinement is the noise reduction method to be described later, which reduces noise by a reduction of the observation time. But since the peak/mean ratio of the level of random noise is only slowly variable with observation time (see FIG. 1) only limited improvements are possible.

This method is attractive since its intrinsic accuracy is unaffected by the properties of the repeaters—being mainly a function of the propagation velocity of a signal in the polythene insulation of the cable, whose variations with sea bed conditions are known and can be allowed for. But it is suitable only for low gain repeaters and for noise sources whose spectrum is fairly independent of frequency.

Because the test apparatus required could be quite simple (see FIG. 7) and because there is some possibility of the occasional large impulse, it could be used and would furthermore be a valuable back-up for a method addressed to the solution of the most intractable problem—which is the location of impulses, on the limit of specification, and occurring substantially in one band only.

In the second embodiment of the invention the two paths are in the same direction of transmission along the system, but in different parts of the frequency spectrum for that direction.

Figure 2A:
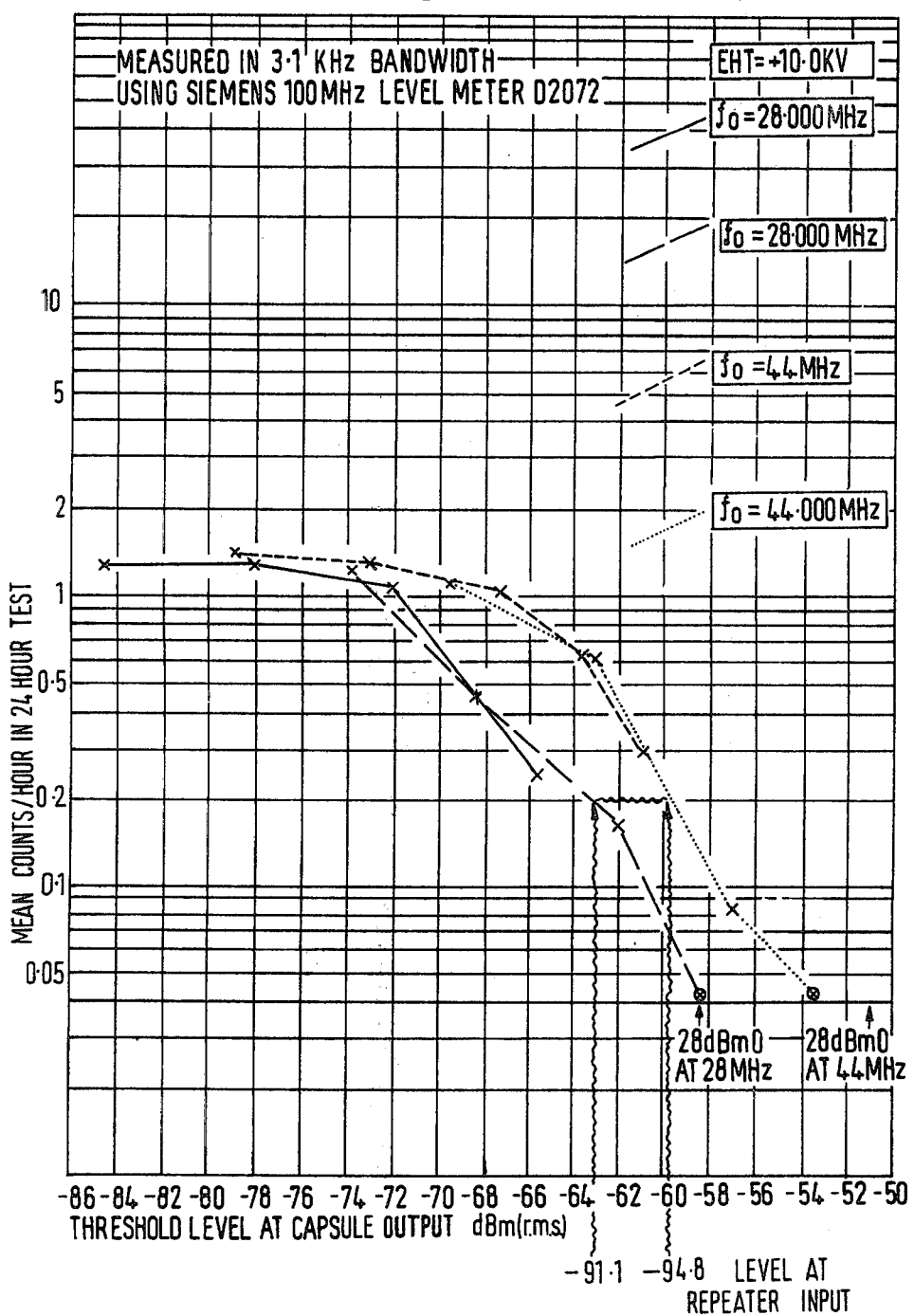
FIGS. 2A and 2B are graphs showing the variation of impulse noise counts with threshold detection level in tests carried out to observe a fault in the high band in a submersible repeater at different frequencies.
Figure 2B:
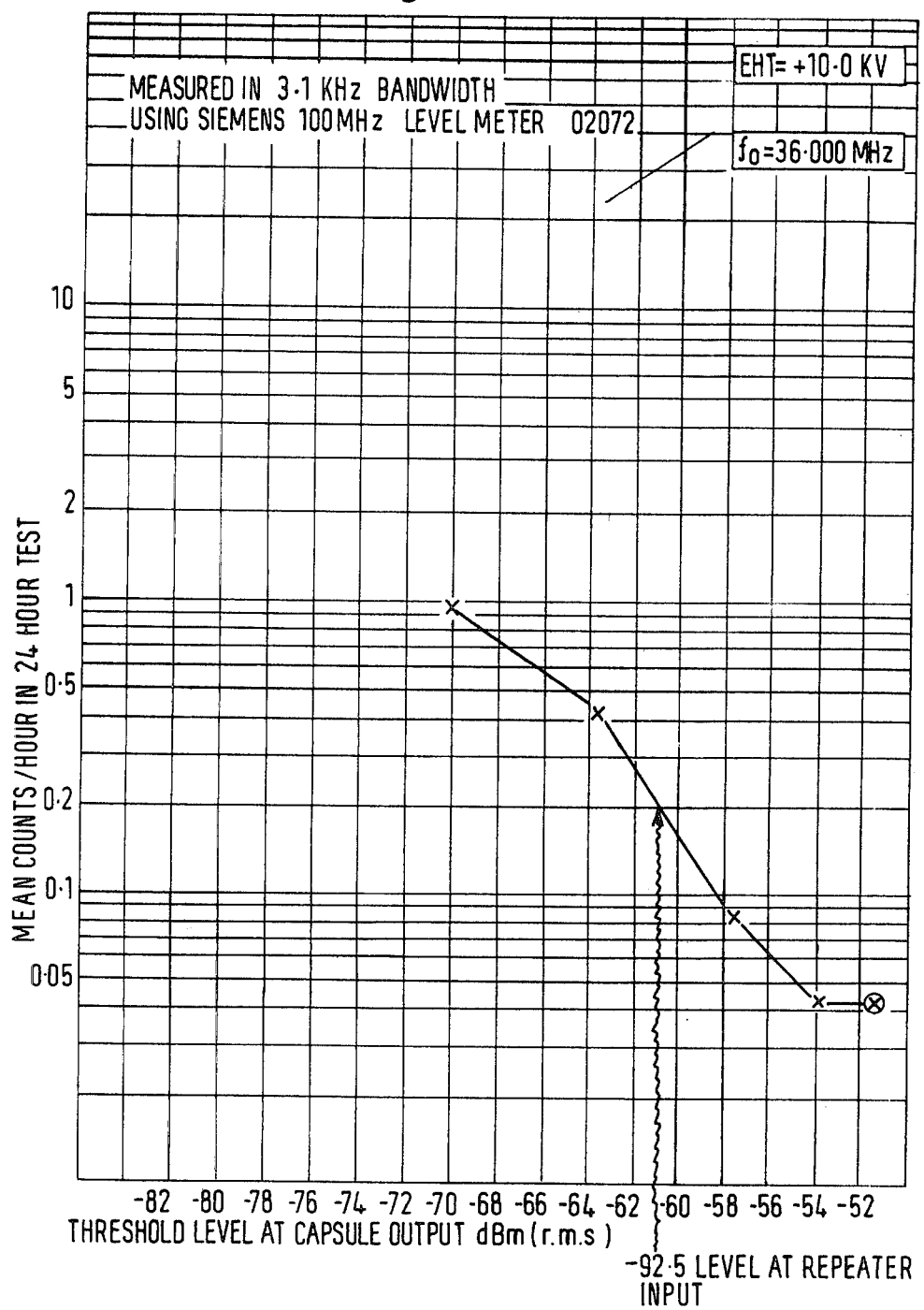

Variations in impulse to thermal noise level ratio with frequency are less likely considering one band only (see FIG. 2, which shows the effect of a fault at the high band input of a repeater). Moreover, if the impulse level in part of the band is obscured by random noise then, by definition, a large part of the band is suitable for data transmission—so that to keep the system in satisfactory service is merely a matter of traffic organisation.

If we regard the problem in terms of an impulse of roughly uniform frequency spectrum covering a large part of the transmission band, then a solution can lie in the fact that the transmission delay is widely different in suitably chosen parts of the band. FIGS. 3 and 4 show the group delay distortion of the high and low bands of one of our typical repeatered sections (NG1). A timer, on the lines described above, should detect the difference in arrival times of the same impulse in two parts of the spectrum—and this difference is proportional to the number of repeaters between the source of the impulse and the observer. Since the time between successive impulses is much greater than this time difference, or the time required for detection, successive impulses are dealt with separately and should record the same result.

Figure 5:
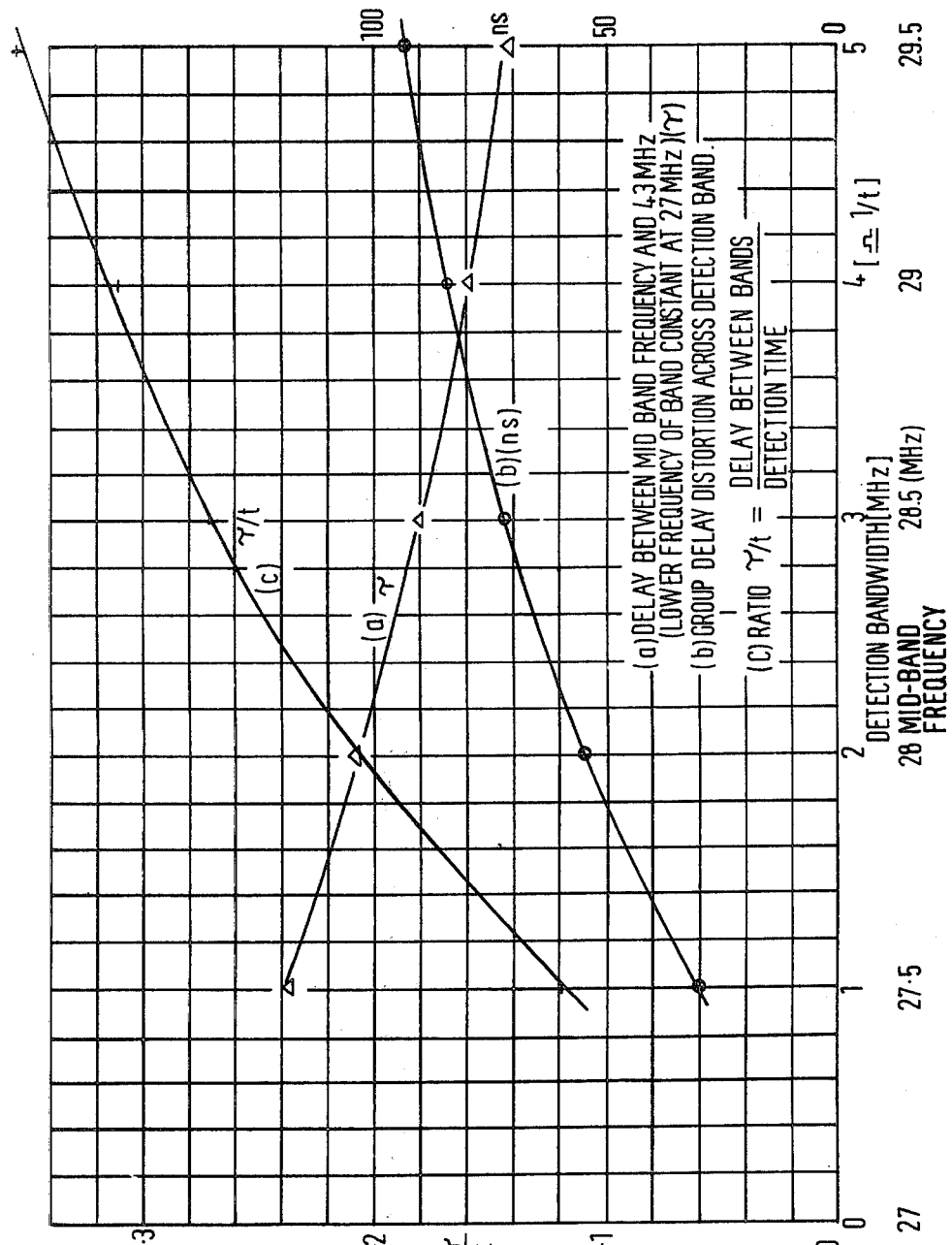
FIG. 5 is a graph illustrating special features of the group delay response of the submersible repeater of FIGS. 3 and 4 in the high band.

But the problem is not so simple. The group delay distortion across the detection band can be as much as the delay between bands so that, to preserve about the same width of impulse in both bands and to avoid an increase in pulse width, the bands should be equalized for group delay distortion (GDD). Coupled with the fact that the time required to trigger the detector (see FIG. 6A—about the reciprocal of the detection bandwidth) is rather more than the delay between the detection bands for a single repeater, this means that a simple timer would be difficult to use. The group delay correction required is a function of the unknown, the position of the fault in the system. FIG. 5 shows, for the high band, the delay between detection bands, the GDD across the worst band and the ratio of the delay between bands to the detection time.

The above difficulties can be alleviated by a null method of detection. We propose to use a detector which records the difference in time between receipt of the two impulses. The required GDD and the delay difference between bands are correlated by the design of the system. A variable network can be constructed for each and the controls coupled together. Then we can introduce these networks into the bands supplying the timer and adjust the control for a zero result. At coincidence, the two impulses should have the same wave shape since they are correctly group delay equalized.

Bearing in mind that it is desirable to test with the system partly in traffic, if possible, so that a limited band may be allotted to the test, and the parameters of FIG. 5, a suitable compromise is a detection band width of 2 MHz, which is small in comparison with the traffic bandwidth of about 17 MHz, centered on, say, 28 MHz and 43 MHz. For this case, the delay per repeater between bands is, at 100 nS (nanoseconds), bout 1/5 of the maximum detection time and the GDD in the $28\pm1$ MHz band is about half of the delay between bands. In principle, this means that the location accuracy is potentially within about 5 repeaters from the fault.

Of course the design of the test apparatus, and its calibration, can be refined in the light of measurements on the system—especially by calibration against the location of an impulse injected artificially at the far end of the system. Because GDD is set by the gross parameters of the system design (instead of by parasitic parameters as is attenuation distortion) and these are accurately made, one would expect GDD to be very uniform along the route—despite misalignments and other aberrations—so that a calibration on the overall system would be quite valid.

The location would be refined if the impulse amplitudes in the two bands were adjusted to be the same at the detection points—since then a discrimination time of less than the bandwidth is possible. A possible method and apparatus to achieve this which, at the same time, can somewhat reduce the confusion of the detector of the intrinsically lower level impulse by random noise, will now be described with reference to FIG. 6.

For simplicity the apparatus shown excludes linear amplifiers.

The incoming line is connected at terminal T1 and enters a hybrid H which splits received signals into respective separate paths P1 and P2. The signals pass through high band pick-off filters F1 and F2 centered on 43 MHz and 28 MHz.

The resultant signals then enter demodulators D1 and D2 which modulate the signal to reduce the band to a frequency range more suitable for the construction of networks. Between 4 and 6 MHz will be suitable although experience with impulse detection apparatus using single side band, quadrature, demodulators would indicate that say $\frac{1}{2}$ to $2\frac{1}{2}$ MHz would be possible and this is more favorable for network construction. The modulation products of the demodulators D1 and D2 are selected by band pass filters F3 and F4.

The signal is then pass via an adjustable attenuator A1, A2 in each path, to respective group delay distortion equalization networks GD1 and GD2. These networks in each path equalize the group delay distortion across each band which results from transmission along the route. The accuracy of group delay distortion equalization should be about the same as the delay between bands for one repeater, i.e. about 100 ns and applies to the calibration accuracy rather than to the value at the nominal setting. Optionally these networks can be combined with the delay networks (to be described later).

These equalization networks are switchable, ganged to each other and to the switchable delay lines. The switch steps, for example, are in ten sets of five and ten sets of fifty, with additional options for one set of five hundred and $\pm2$ (in terms of numbers of repeater sections), although binary quantities could be used instead. The position of the equalization networks is chosen to minimize the delay required of the delay lines.

From the group delay equalization networks GD1 and GD2 the signals pass through rectifiers R1 and R2 which provide unidirectional impulses from the signal, are preferably linear and are set to have equal adjustable thresholds.

An impulse detector ID, switchable to the output of either rectifier is used to open the comparator gates, described later.

The impulse signals then pass through respective delay lines DL1 and DL2. Path P1 has an adjustable delay line ADL in the frequency range 0 to 1 MHz. Path P1 is arranged to have the least delay and the adjustable delay line ADL is switchable in steps corresponding to the steps of the group delay equalization networks GD1 and GD2. It is also ganged with these networks. The delay introduced by the group delay equalization networks affects the amount of delay required, which may be negative, which is the equivalent of a positive delay in the other path P2.

The delay lines DL1 and DL2 each include a delay network DN1 and DN2 to delay the impulses until gates G1 and G2 which are set by the impulse detector ID, are opened.

The delay lines each also include a second delay network DN3 and DN4 to equalize the response times of the paths P1 and P2, with the group delay distortion networks GD1 and GD2 and the adjustable delay ADL, set to zero. The residual group delay distortion across each band, with the controls set at zero, should be equalized if necessary. Each path has a gate G1 and G2 which is opened by the impulse detector ID, and set to open before the impulses arrive at the gates and also set to close after a time somewhat longer than the maximum difference in transmission delay between the two paths for the shole route.

The gates G1 and G2 feed respective impulse detectors ID1 and ID2. The operation times are repeatably similar and $<1/5$th us.

The difference timer DT reads the time difference of the impulse detectors and its sense between the operation time of the gates G1 and G2.

A ballistic detector BD is coupled to the paths P1 and P2 to receive directly the outputs from the gates G1 and G2 and detects the amplitude and the sign of the algebraic difference between the outputs of the two gates. This can take the form of a differential amplifier feeding a (short term) integrating meter. It should have an adjustable threshold.

The operating procedure is to set the delay ADL and attenuators A1 or A2 to minimize the indication of the difference timer DT and the amplitude subtractor BD, together. The delay setting would be calibrated in numbers of repeaters and gives the "distance" to the fault.

In the low band, suitable bands would be at say 7 MHz and 18 MHz, or at a 7 MHz and 3 MHz, according to the type of impulse noise experienced. The low frequency type of noise may be locatable only if the impulse level is fairly high. But if it is not high, then most of the band should remain suitable for data transmission.

The apparatus works as follows. The detector ID on detection of the first received impulse, which may be optionally in either band, is arranged to open the two gates G1 and G2. As stated above the "open" time of these gates, which can be controllable, is arranged to be much longer than the time difference between the same impulse arrivals by the two different paths (initially the maximum difference in transmission times along the system), but much shorter than the time between successive impulses.

The impulse detectors ID1 and ID2 are used to detect coincidence. These detectors operate in an environment which is largely free of ambient noise because the gates are open for only a small fraction of the available time.

The delay lines DL1 and DL2, equal in each path, are necessary to ensure that the initial impulse detector ID can open the gates before the impulses arrive at the gates.

The average DC level of two impulses which are of the same wave shape and which are subtracted, has a sign which depends only on their amplitude difference. If their time difference is not too great, then the ballistic detector BD can detect a null when their relative amplitudes are adjusted. Since the average ambient noise level, as distinguished from the peak level of the ambient noise, detected is reduced by the gates to small proportions, this procedure can be used, looking at the response to successive impulses, to equalize the impulse amplitudes to the coincidence detectors.

With this method the detectors ID1 and ID2 can be arranged to operate at the same part of the impulse waveform and this shortens the discrimination time and thus improves the accuracy of location.

By these means it should be possible to reduce the location inaccuracy until it is limited only by non-uniformities in group delay distortion along the route and the accuracy of the calibration of the compensating networks.

Reference will now be made to FIG. 7 of the drawing which illustrates the embodiment of the invention wherein the two paths are in opposite directions and looped at a remote end of the system for reception at the other end. It is assumed that reception will be in the low band, although it could equally well be in the high band.

The apparatus is connected to the low band at terminal LT1 and a pick-off filter PF centered on 7 MHz selects the required band and the signal is fed to a demodulator LD in which the band is modulated with a frequency generator to produce a modulation product in the 4 to 5 MHz band. This is selected by a band-pass filter BPF.

For the high band, the carrier would be about 48 MHz and the input pick-off filter 43 to 44 MHz, as previously discussed.

The signal is then fed to a low band group delay compensator which gives delay distortion compensation across the 6.5 to 7.5 MHz band to compensate for the group delay distortion on the route on the incoming band. At the remote terminal 43.5 to 7 MHz translation equipment would be required and this would need to be group delay distortion equalized. Also the loop apparatus contains the return band group delay equalizer and the counterpart in the high band of the low band group comparator GDC, at 43 to 44 MHz. This would be switched on demand from the receiving terminal.

Referring back to the drawing, the signal from the group delay compensator GDC, is rectified by a rectifier R to produce a unidirectional impulse and this is fed both to an impulse detector DET1 and a gate G.

One output from the impulse detector DET1 will start a difference timer TIM and the other output from the impulse detector DET1 passes via a delay DEL to the gate G. This acts as an opening signal to the gate G and enables the impulse received via the longer route to pass through the gate G to the second impulse detector DET2.

The output from the impulse detector DET2 acts as a stop signal to the difference timer which can therefore measure the time difference between receipt of the impulse via the shorter route and receipt of the impulse the second time via the longer route.

The gate G is set by the first (high level) impulse detector DET1 with a delay only sufficient to prevent the second detector DET2 operating on the first impulse. The gate is closed after detector DET2 operates. To give some idea, the propagation time per repeatered section is approximately 30 $\mu$secs (microseconds) and the detection time is approximately equal to 1 $\mu$sec.

It should be noted that any necessary linear amplifiers are not shown in the drawing and neither are any re-set devices for resetting the apparatus to detect a second impulse. From the foregoing description of the two main embodiments, it is evident that a great deal of apparatus, especially for the networks, is required, particularly in the method and apparatus of FIG. 6. The scale of this can be gauged from the fact that to equalize 3 $\mu$secs of group delay distortion to TV grade accuracy (about 50 ns) requires some 30 networks. Here, for example, for the proposed TAT 7 link and to lower accuracy, we must equalize some 50 microseconds in a 2 MHz band, which is roughly equivalent in difficulty to 17 microseconds in a TV band. The matter is simply one of scale and calibration accuracy.

It can be seen that the massive group delay equalization necessary for single way transmission location, such as that described with reference to FIG. 6, is unnecessary for bi-directional transmission as described with reference to FIG. 7, because the bandwidth can be smaller in the best parts of the spectra, and the propagation time differences between repeaters are much greater.

While I have described above the principles of my invention in connection with specific apparatus it is to be clearly understood that this description is made only by way of example and not as a limitation to the scope of my invention as set forth in the objects thereof and in the accompanying claims.

I claim:

1. A method of locating a source of impulse noise in a communication system comprising the steps of:
    measuring the time interval between the same noise impulse arriving at one terminal of said system via two paths of said system having different delays; and
    indicating said time interval in a manner representing the distance of said source of said impulse from said one terminal to locate the position of said source of said impulse in said system.

2. A method according to claim 1, wherein
    said two paths are in the same direction of transmission in said system but located in different first frequency bands of the frequency spectrum for that transmission direction.

3. A method according to claim 2, wherein each of said two paths in its associated one of said first frequency bands has a bandwidth which is small when compared to the bandwidth of the traffic band.

4. A method according to claim 3, further including he steps of:
compensating for group delay distortion of each of said two paths in separate networks at said one terminal of said system so that the arrivals of said impulse over said two paths occur simultaneously and with the same waveform at a detection point at the output of said separate networks; and
detecting said simultaneous arrival at said detection point.

5. A method according to claim 4, further including he steps of
demodulating said impulse in each of said two paths to second frequency bands different from said first frequency bands.

6. A method according to claim 4, further including he step of
adjusting the amplitude of said impulse in each of said two paths to be equal.

7. A method according to claim 6, further including he steps of
demodulating said impulse in each of said two paths to second frequency bands different from said first frequency band.

8. Apparatus for locating a source of impulse noise in communication system comprising:
impulse detection means disposed in one terminal of said system to detect the arrival of a noise impulse at said one terminal over a first faster or short path in said system and a second slower or longer path in said system; and
means coupled to said detection means to measure the time interval between the two arrivals of said impulse and to indicate said interval in a manner representing the distance of said source of said impulse from said one terminal of said system to locate the position of said source of said impulse in said system.

9. Apparatus according to claim 8, wherein
the said impulse is propagated in both a go path and a return path with respect to said one terminal of said system,
said first path includes said return path, and
said second path includes said go path,
a loop disposed in the other terminal of said system to connect said go path and said return path, and said return path.

10. Apparatus according to claim 9, wherein
said impulse detection means includes
a demodulator for changing the frequency band of said impulse.

11. Apparatus according to claim 8, wherein
said first and second paths are in the same direction of transmission in said system but in different first frequency bands of the frequency spectrum for that direction of transmission.

12. Apparatus according to claim 11, wherein
said detection means includes
a first circuit path responsive to one of said first frequency bands, and
a second circuit path responsive to the other of said first frequency bands.

13. Apparatus according to claim 12, wherein
each of said first and second circuit paths include
a demodulator to change the associated one of said first frequency bands to a second frequency band lower than the associated one of said first frequency bands 14. Apparatus according to claim 13, wherein
each of said second frequency bands are the same.

15. Apparatus according to claim 12, wherein each of said first and second circuit paths include:
an equalization network coupled to the input of said detection means to compensate for system group delay distortion and attenuation in the associated one of said first frequency bands, and
a delay network coupled to said equalization network, at least one of said delay networks being adjustable to cause coincidence of arrival and equality of amplitude of said impulse, and
coincidence detector means coupled to said first and second circuit paths to indicate said coincidence.

16. Apparatus according to claim 15, wherein each of said first and second paths include:
a demodulator coupled between said equalization network and said input of said detection means to change the associated one of said first frequency bands to a second frequency band lower than the associated one of said first frequency bands.

17. Apparatus according to claim 16, wherein
each of said second frequency bands are the same.

18. Apparatus according to claim 17, further including:
a first impulse detector selectively coupled to each of said first and second circuit paths before said delay network therein to detect the presence of said impulse in each of said circuit paths; and
a gate circuit in each of said first and second circuit paths coupled to the output of the associated one of said delay networks, each of said gate circuits being rendered operative for a limited period of time by said first detector to feed said impulse to second and third impulse detectors.

19. Apparatus according to claim 8, further including gate means disposed in said detection means arranged to reduce the observation time for arrivals of said impulse to a minimum necessary for detecting said arrivals so as to reduce ambient noise level.

* * * * *